United States Patent
Cheng et al.

(10) Patent No.: US 9,114,976 B1
(45) Date of Patent: Aug. 25, 2015

(54) SEMICONDUCTOR ARRANGEMENT WITH STRESS RELEASE CONFIGURATION

(71) Applicant: Taiwan Semiconductor Manufacturing Company Limited, Hsin-Chu (TW)

(72) Inventors: Chun-Wen Cheng, Zhubei (TW); Chia-Hua Chu, Zhubei (TW); Yi-Chuan Teng, Zhubei (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 14/200,075

(22) Filed: Mar. 7, 2014

(51) Int. Cl.
*H01L 21/00* (2006.01)
*B81B 7/00* (2006.01)
*B81C 1/00* (2006.01)

(52) U.S. Cl.
CPC ........... *B81B 7/0054* (2013.01); *B81C 1/00325* (2013.01); *B81B 7/008* (2013.01); *B81C 1/00269* (2013.01); *H01L 2924/1461* (2013.01)

(58) Field of Classification Search
USPC .......................................................... 438/50
See application file for complete search history.

(56) References Cited

U.S. PATENT DOCUMENTS

| | | | | |
|---|---|---|---|---|
| 2007/0273013 A1* | 11/2007 | Kohl et al. | | 257/682 |
| 2011/0156106 A1* | 6/2011 | Lee et al. | | 257/254 |
| 2011/0165717 A1* | 7/2011 | Lee et al. | | 438/50 |
| 2012/0313235 A1* | 12/2012 | Chu et al. | | 257/692 |
| 2012/0326248 A1* | 12/2012 | Daneman et al. | | 257/415 |
| 2015/0061046 A1* | 3/2015 | Chang et al. | | 257/415 |

* cited by examiner

*Primary Examiner* — Asok K Sarkar
(74) *Attorney, Agent, or Firm* — Cooper Legal Group, LLC

(57) ABSTRACT

Among other things, one or more semiconductor arrangements and techniques for forming such semiconductor arrangements are provided herein. A semiconductor arrangement comprises a cap wafer, a microelectromechanical systems (MEMS) wafer, and a complementary metal-oxide-semiconductor (CMOS) wafer. The cap wafer comprises a first spring structure and the MEMS wafer comprises a second spring structure. The first spring structure and the second spring structure relieve stress as portions of the semiconductor arrangement, such as a membrane and a poly layer, move. An ambient pressure chamber is formed between the CMOS wafer and the MEMS wafer as a thermal insulation air gap to protect the MEMS wafer from heat originating from the CMOS wafer. The ambient pressure chamber is connected to ambient air, such as for CMOS outgassing relief.

20 Claims, 19 Drawing Sheets

SEMICONDUCTOR ARRANGEMENT WITH STRESS RELEASE CONFIGURATION

BACKGROUND

Complementary metal-oxide-semiconductor (CMOS) is a technology used in constructing integrated circuits, such as image sensors, data converters, communication modules, etc. Many integrated circuits or semiconductor arrangements thus comprise CMOS wafers or at least one or more portions of a wafer whereon CMOS technology is implemented. Heat from a CMOS wafer, such as from outgassing, can damage other portions of a semiconductor arrangement. A semiconductor arrangement can also be damaged from stress, such as printed circuit board stress. For example, stress-induced solder joint failure can occur from such stress.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
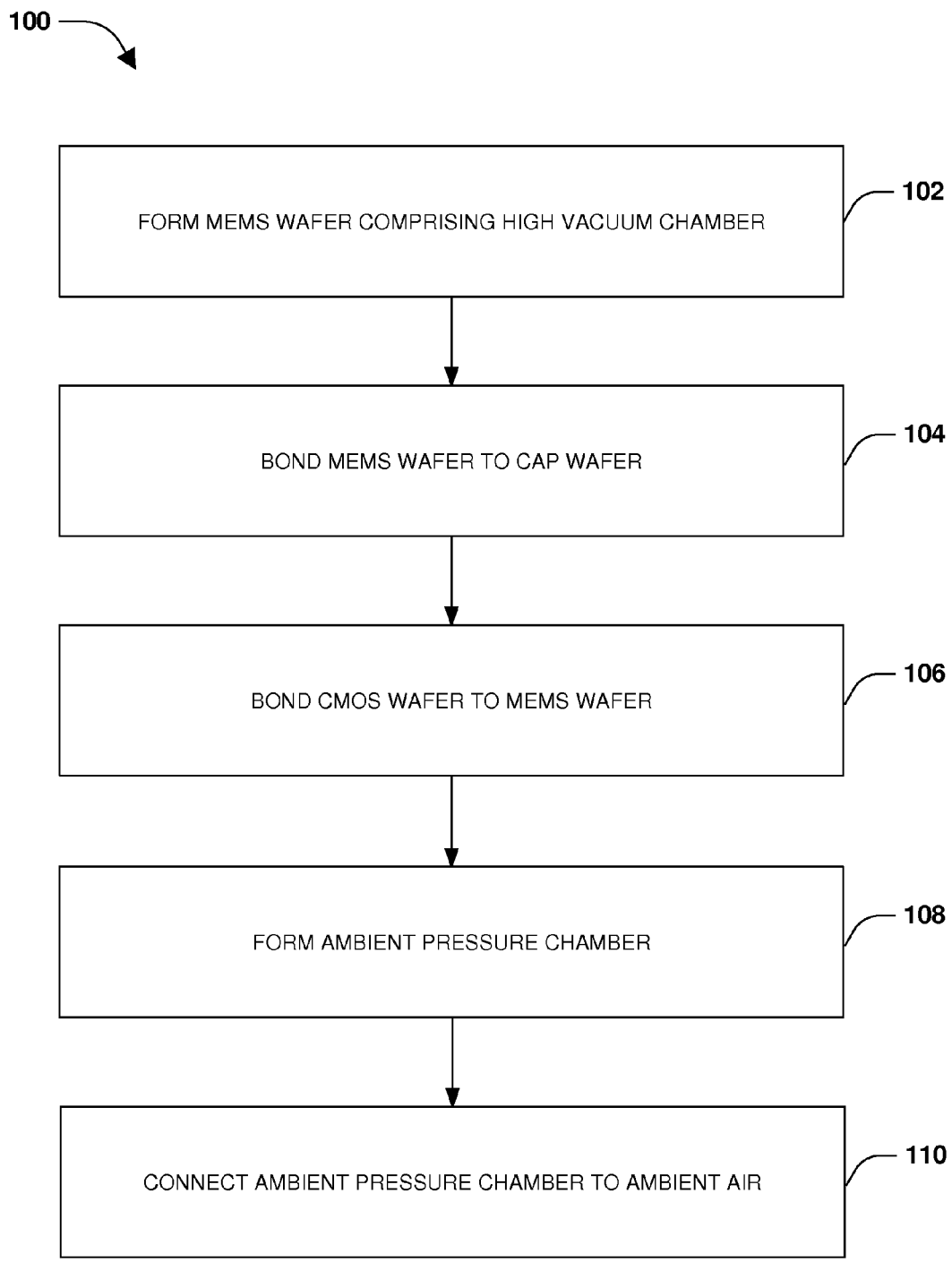
FIG. 1 is a flow diagram illustrating a method of forming a semiconductor arrangement, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more semiconductor arrangements and techniques for forming such semiconductor arrangements are provided. In some embodiments, a semiconductor arrangement comprises a cap wafer. The cap wafer comprises a first vacuum chamber and a second vacuum chamber. The second vacuum chamber is configured as a first spring structure. The semiconductor arrangement comprises a microelectromechanical systems (MEMS) wafer formed over the cap wafer. The MEMS wafer comprises a high vacuum chamber coupled to the first vacuum chamber. The high vacuum chamber is configured as a sensing gap. The semiconductor arrangement comprises a complementary metal-oxide-semiconductor (CMOS) wafer formed over the MEMS wafer. The CMOS wafer comprises an ambient pressure chamber connected to the second vacuum chamber through a second spring structure. The first spring structure and the second spring structure are operable based upon deformation of the sensing gap. In some embodiments, at least one of the first spring structure or the second spring structure move, such as compress, to release stress that occurs from movement of the semiconductor arrangement, such as movement of a membrane of the MEMS wafer with respect to a poly layer of the MEMS wafer that deforms the sensing gap. Such movement and deformation occurs from a pressure difference between the high vacuum chamber, formed between the membrane and the poly layer, and the ambient pressure chamber connected to ambient air. The ambient pressure chamber is configured as a thermal insulation air gap to insulate the MEMS wafer from heat originating from the CMOS wafer. In this way, CMOS outgassing, stress, and thermal damage are mitigated for the semiconductor arrangement.

Figure 2:
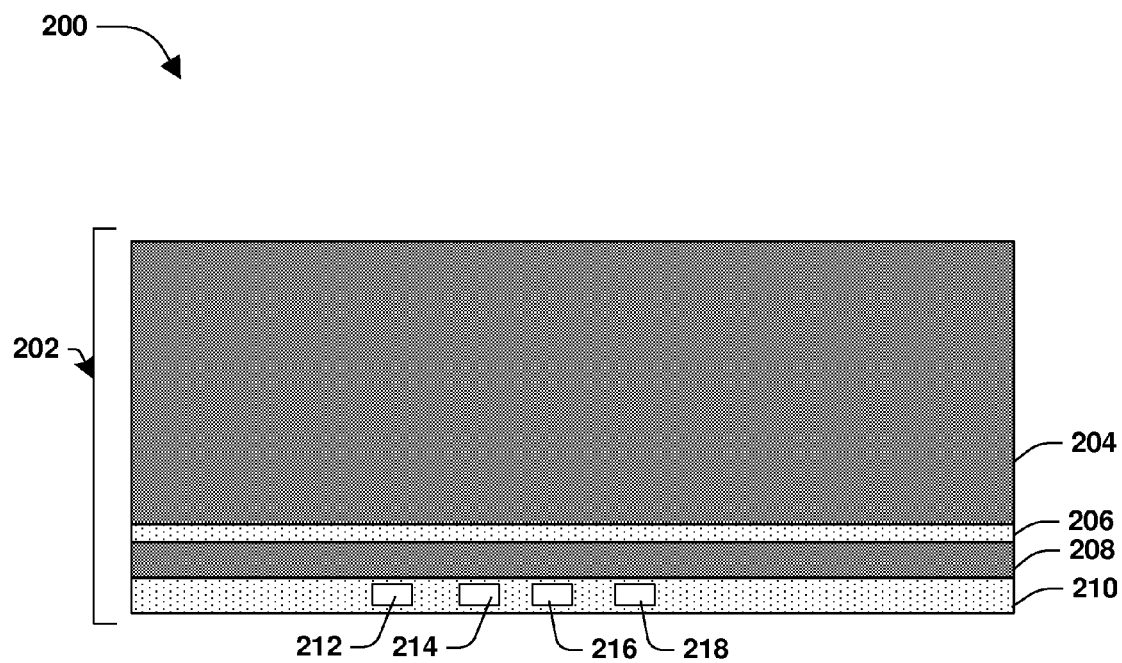
FIG. 2 is an illustration of a semiconductor arrangement comprising a microelectromechanical systems (MEMS) wafer, in accordance with some embodiments.

A method 100 of forming a semiconductor arrangement is illustrated in FIG. 1, and one or more semiconductor arrangements formed by such a methodology are illustrated in FIGS. 2-14E. At 102, a MEMS wafer 202 of a semiconductor arrangement 200 is formed, as illustrated in FIG. 2. In some embodiments, a silicon-on-insulator (SOI) wafer comprising a first silicon layer 204, a first oxide layer 206, and a second silicon layer 208 is used to form the MEMS wafer 202, as illustrated in FIG. 2. A second oxide layer 210 is deposited on the on the second silicon layer 208. In some embodiments, oxide seam trench formation is performed to form one or more trenches, such as a first trench 212, a second trench 214, a third trench 216, a fourth trench 218, or other trenches, into the second oxide layer 210.

Figure 3:
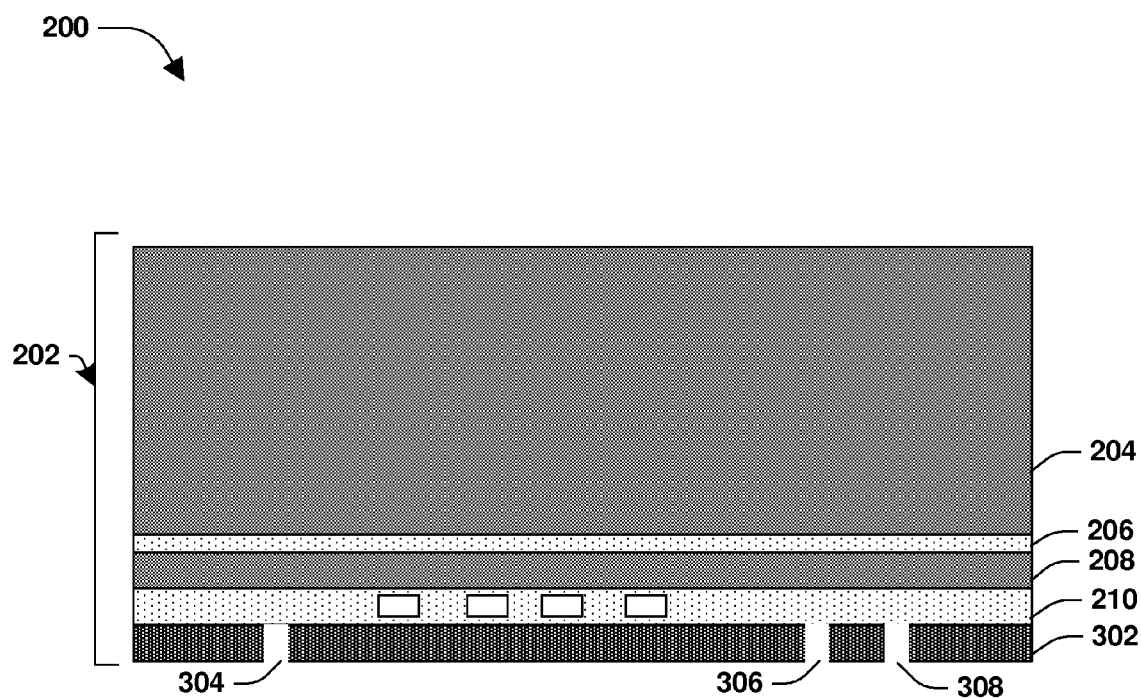
FIG. 3 is an illustration of a semiconductor arrangement comprising a microelectromechanical systems (MEMS) wafer, in accordance with some embodiments.

A poly layer 302 is formed on the second oxide layer 210 of the MEMS wafer 202, as illustrated in FIG. 3. In some embodiments, the poly layer 302 is formed by a deposition process. In some embodiments, the poly layer 302 has a thickness between about 0.5 um and about 1.5 um. In some embodiments, chemical mechanical polishing (CMP) is performed on the poly layer 302. In some embodiments, the poly layer 302 is patterned to form one or more trenches, such as a first trench 304, a second trench 306, a third trench 308, or other trenches.

Figure 4:
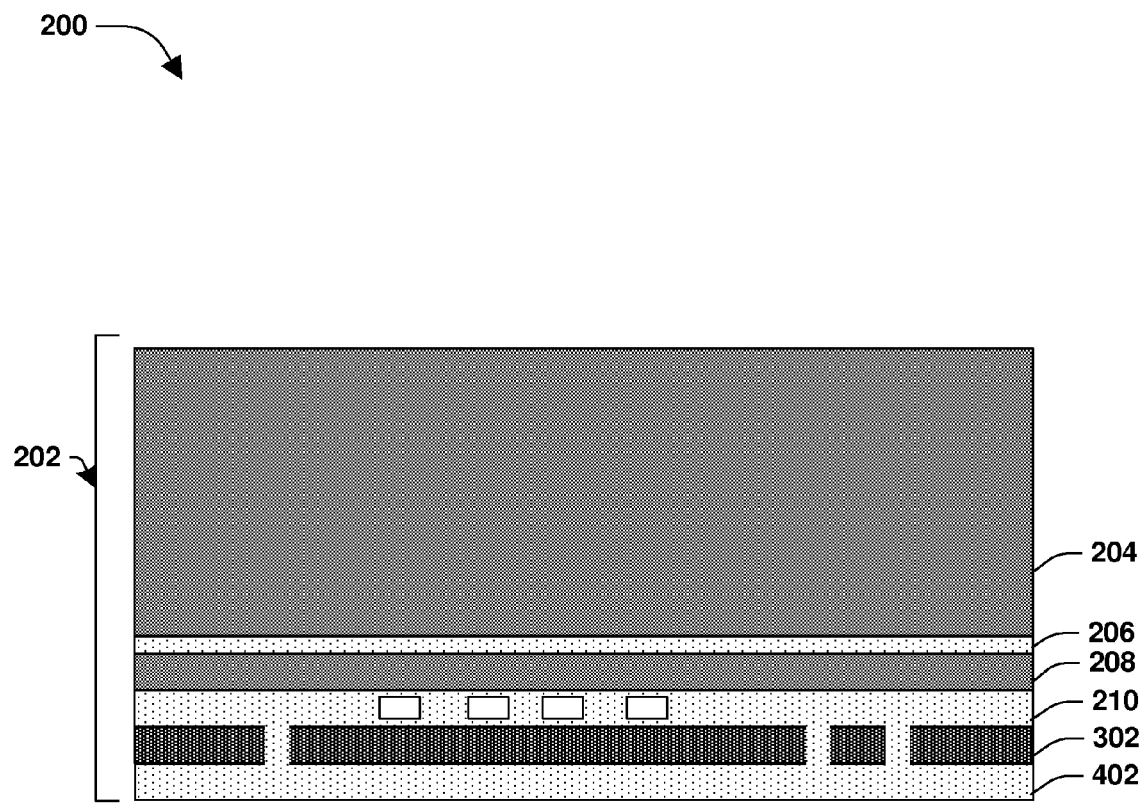
FIG. 4 is an illustration of a semiconductor arrangement comprising a microelectromechanical systems (MEMS) wafer, in accordance with some embodiments.

A third oxide layer 402 is formed on the poly layer 302, as illustrated in FIG. 4. In some embodiments, the third oxide layer 402 is formed by an oxide deposition process. In some embodiments, an annealing process is performed after the oxide deposition process. In some embodiments, the oxide deposition process fills the first trench 304, the second trench 306, and the third trench 308 with poly.

Figure 5:
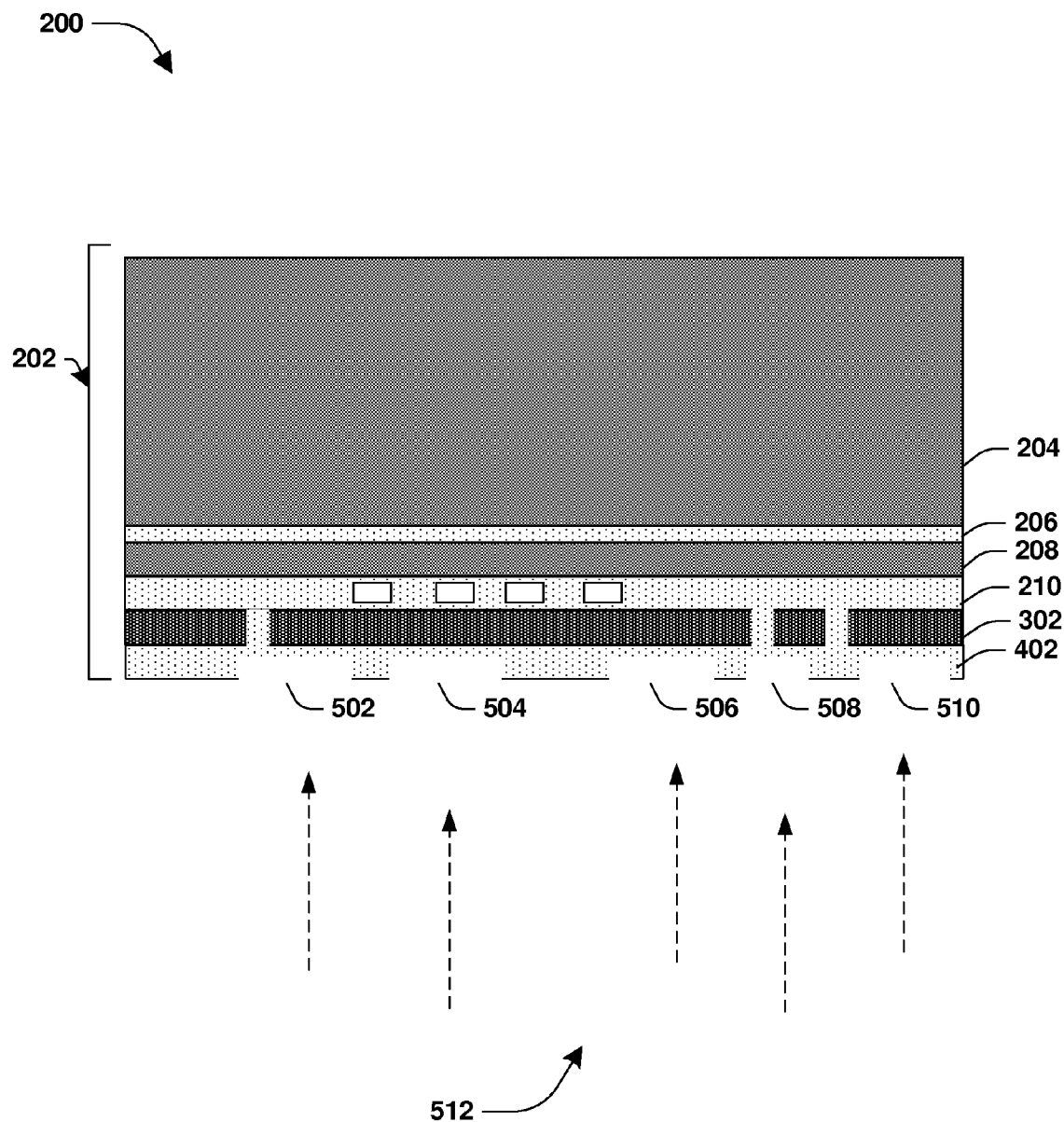
FIG. 5 is an illustration of a semiconductor arrangement comprising a microelectromechanical systems (MEMS) wafer, in accordance with some embodiments.

A cavity etch 512 is performed to create one or more cavities into the third oxide layer 402, as illustrated in FIG. 5.

In some embodiment, the cavity etch 512 forms a first cavity 502, a second cavity 504, a third cavity 506, a fourth cavity 508, a fifth cavity 510, or other cavities into the third oxide layer 402.

Figure 6:
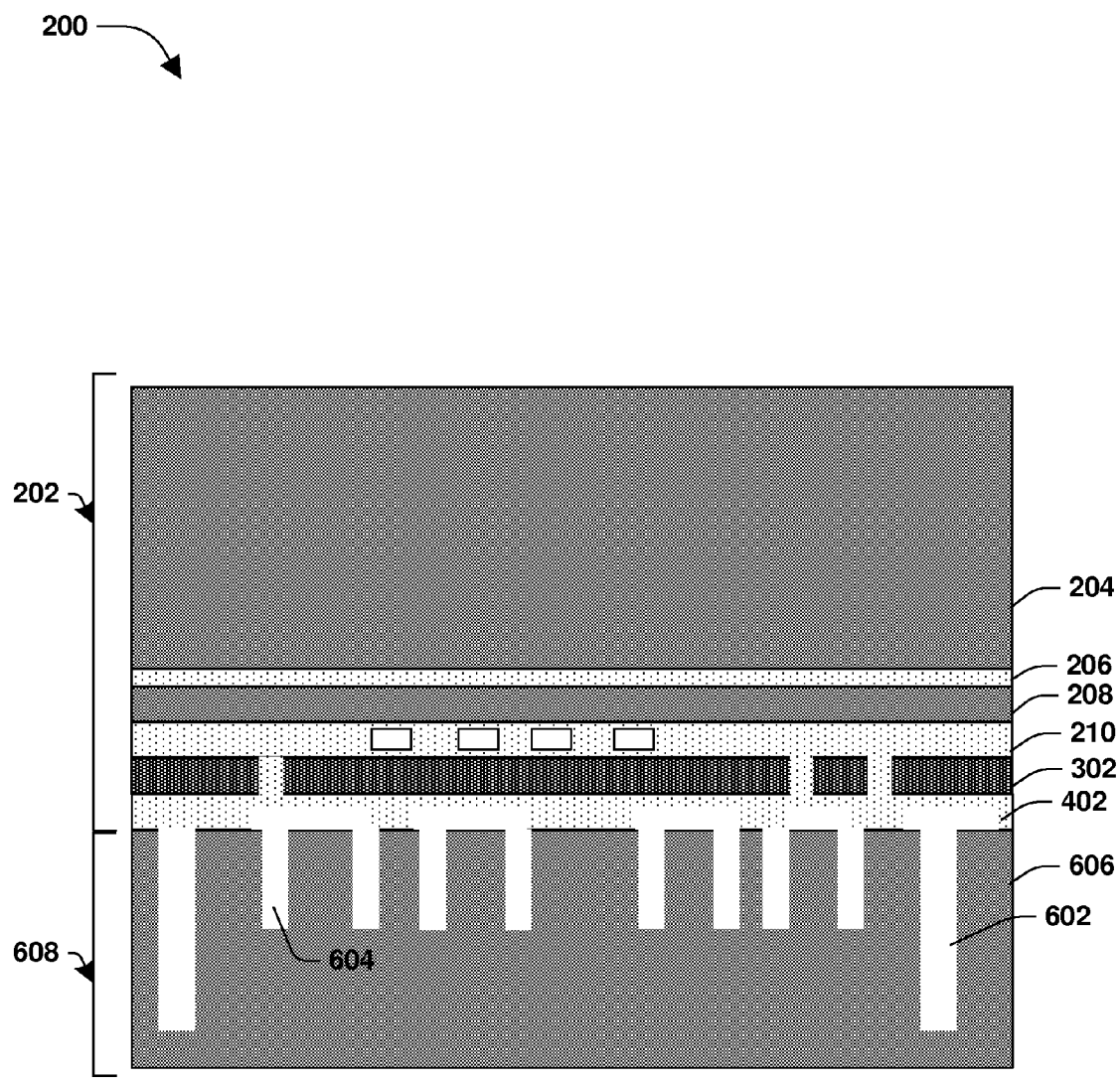
FIG. 6 is an illustration of a semiconductor arrangement comprising a microelectromechanical systems (MEMS) wafer bonded to a cap wafer, in accordance with some embodiments.

At 104, the MEMS wafer 202 is bonded with a cap wafer 608, as illustrated in FIG. 6. In some embodiments, a fusion bonding technique is performed to fuse the MEMS wafer 202 to the cap wafer 608. In some embodiments, an annealing process is performed after the fusion bonding technique. The cap wafer 608 comprises a silicon layer 606. The cap wafer 608 comprises one or more trenches formed through the silicon layer 606 as vacuum chambers. In some embodiments, a first vacuum chamber 604 is formed from a first trench. A second vacuum chamber 602 is formed from a second trench. In some embodiments, the first vacuum chamber 604 has a first depth that is less than a second depth of the second vacuum chamber 602. In some embodiments, a first silicon etch, such as a relatively slower etch using a relatively smaller opening, is performed to form one or more trenches having the first depth, such as the first trench formed as the first vacuum chamber 604. A second silicon etch, such as a relatively faster etch using a relatively larger opening, is performed to form one or more trenches having the second depth, such as the second trench formed as the second vacuum chamber 602.

Figure 7:
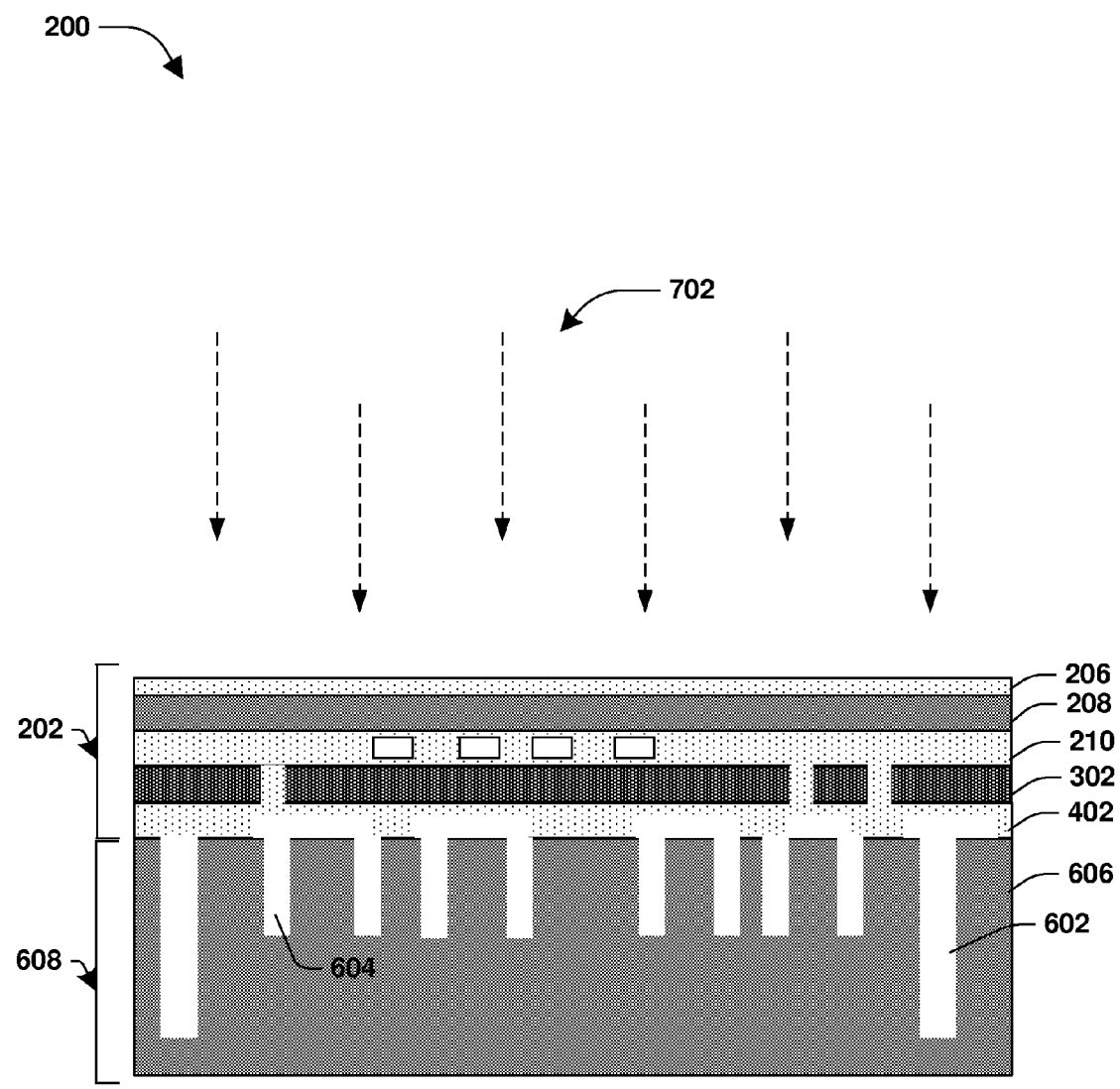
FIG. 7 is an illustration of a semiconductor arrangement comprising a microelectromechanical systems (MEMS) wafer bonded to a cap wafer, in accordance with some embodiments.

The first silicon layer 204 is removed 702 from the MEMS wafer 202, as illustrated in FIG. 7. In some embodiments, a grinding process is performed to remove the first silicon layer 204. In some embodiments, a back etching process is performed to remove the first silicon layer 204. In some embodiments, CMP is performed after the back etching process.

Figure 8:
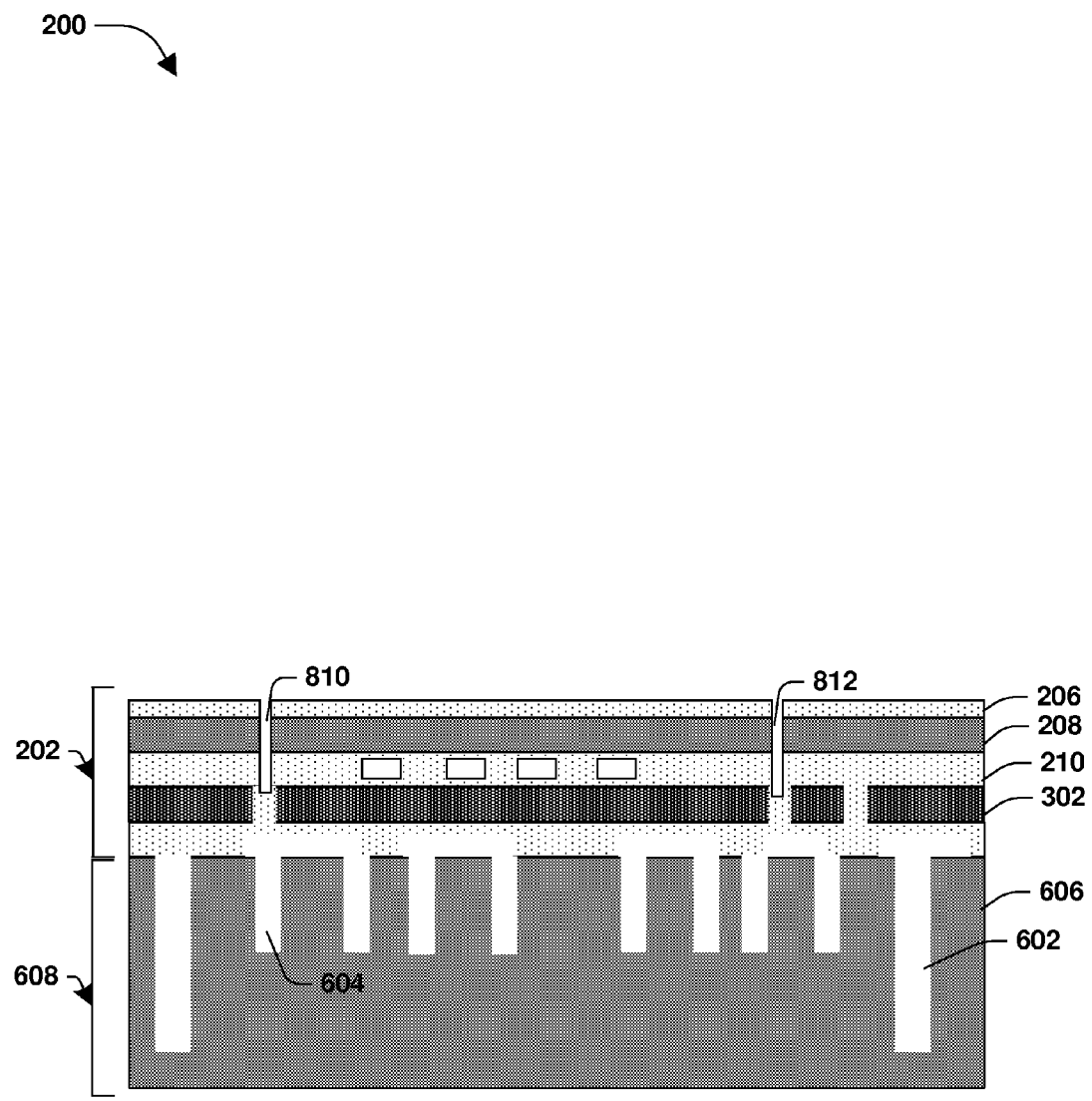
FIG. 8 is an illustration of a semiconductor arrangement comprising a microelectromechanical systems (MEMS) wafer bonded to a cap wafer, in accordance with some embodiments.

One or more pattern release holes, such as a first pattern release hole 810 and a second pattern release hole 812, are formed through the first oxide layer 206, the second silicon layer 208, and the second oxide layer 210, as illustrated in FIG. 8. In some embodiments, a pattern release hole comprises a sub-micrometer width release hole or trench that is etched to a depth suitable for controlling vHF processing time, such as to a depth where about a few micrometers of oxide layer remain below the pattern release hole.

Figure 9:
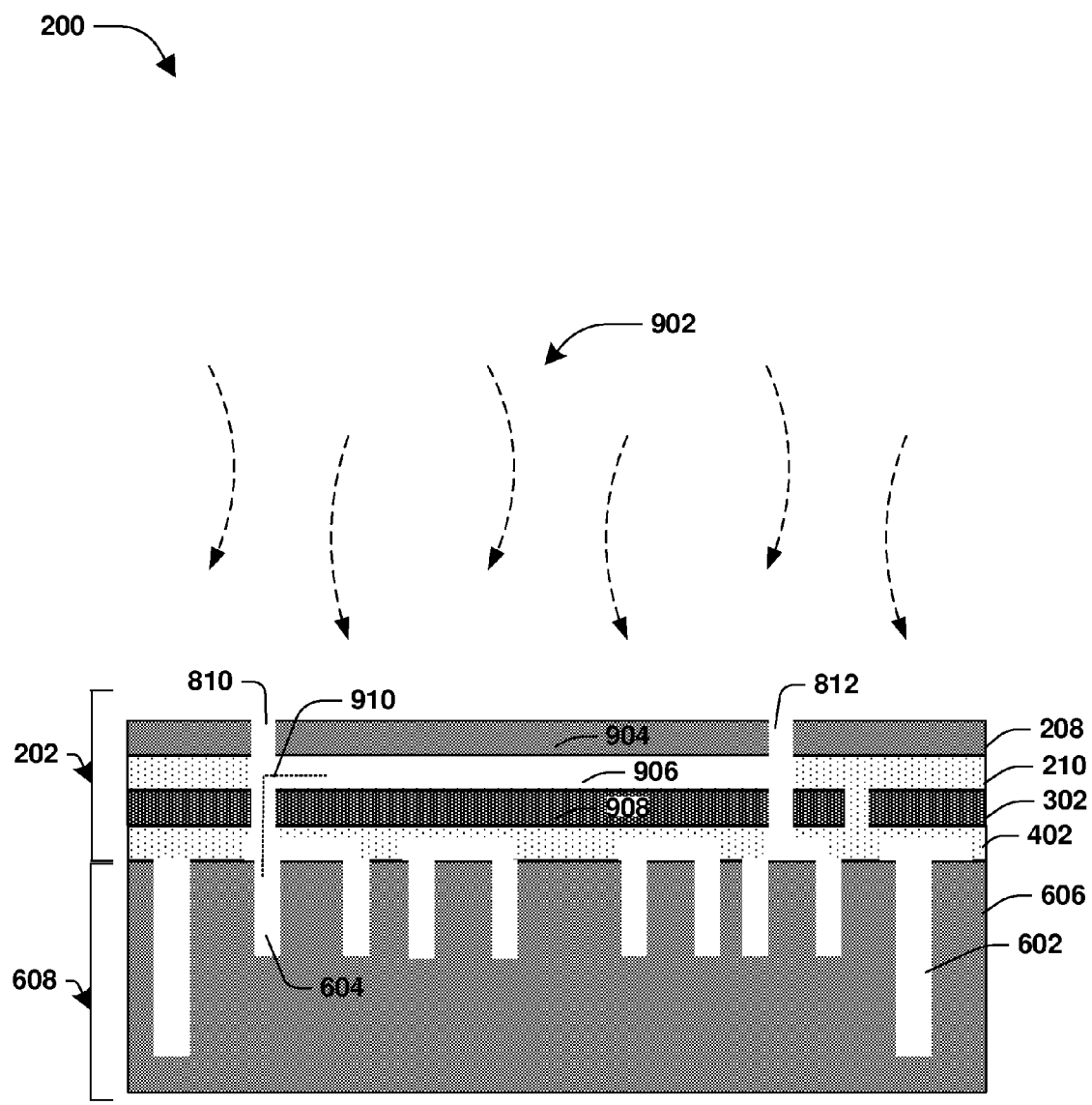
FIG. 9 is an illustration of a semiconductor arrangement comprising a microelectromechanical systems (MEMS) wafer bonded to a cap wafer, in accordance with some embodiments.

The first oxide layer 206 and a portion of the second oxide layer 210 are removed, as illustrated in FIG. 9. In some embodiments, an etch 902, such as a vapor hydrogen fluoride (VHF) release, a dry etch, or acid etch, is performed to remove the portion of the second oxide layer 210 to form a high vacuum chamber 906. The etch 902 is performed to form a connection 910 between the high vacuum chamber 906 and the first vacuum chamber 604. A portion of the poly layer 302, such as a poly layer 908, is formed between the cap wafer 608 and the high vacuum chamber 906. In some embodiments, the poly layer 908 is formed between the third oxide layer 402 and the high vacuum chamber 906. A portion of the second silicon layer 208 is formed as a membrane 904 over the poly layer 908. In some embodiments, the high vacuum chamber is formed between the membrane 904 and the poly layer 908, such that the membrane can move with respect to the poly layer 908.

Figure 10A:
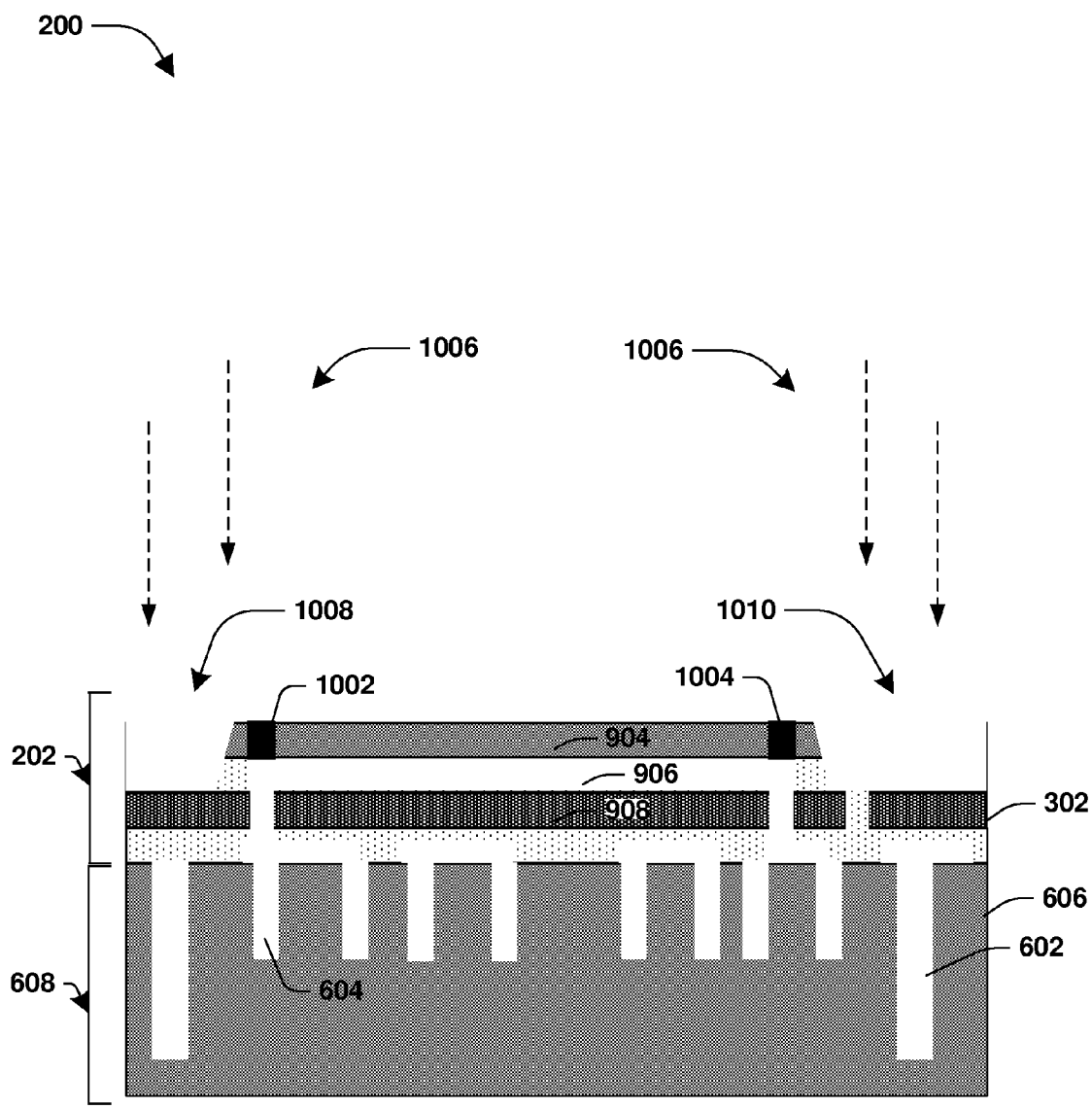
FIG. 10A is an illustration of a semiconductor arrangement comprising a microelectromechanical systems (MEMS) wafer bonded to a cap wafer, in accordance with some embodiments.

In some embodiments, the first pattern release hole 810, the second pattern release hole 812, or other pattern release holes are filled with a metal, as illustrated in FIG. 10A. In some embodiments, the first pattern release hole 810 is filled with metal to form a first metal structure 1002. The second pattern release hole 812 is filled with metal to form a second metal structure 1004. In this way, the high vacuum chamber 906 is sealed, such as from ambient air. In some embodiments, the metal is sputtered onto the MEMS wafer 202. In some embodiments, the metal is aluminum. An etching process 1006, such as a photo etching process, is performed to remove a first side portion 1008 and a second side portion 1010 of the MEMS wafer 202.

Figure 10B:
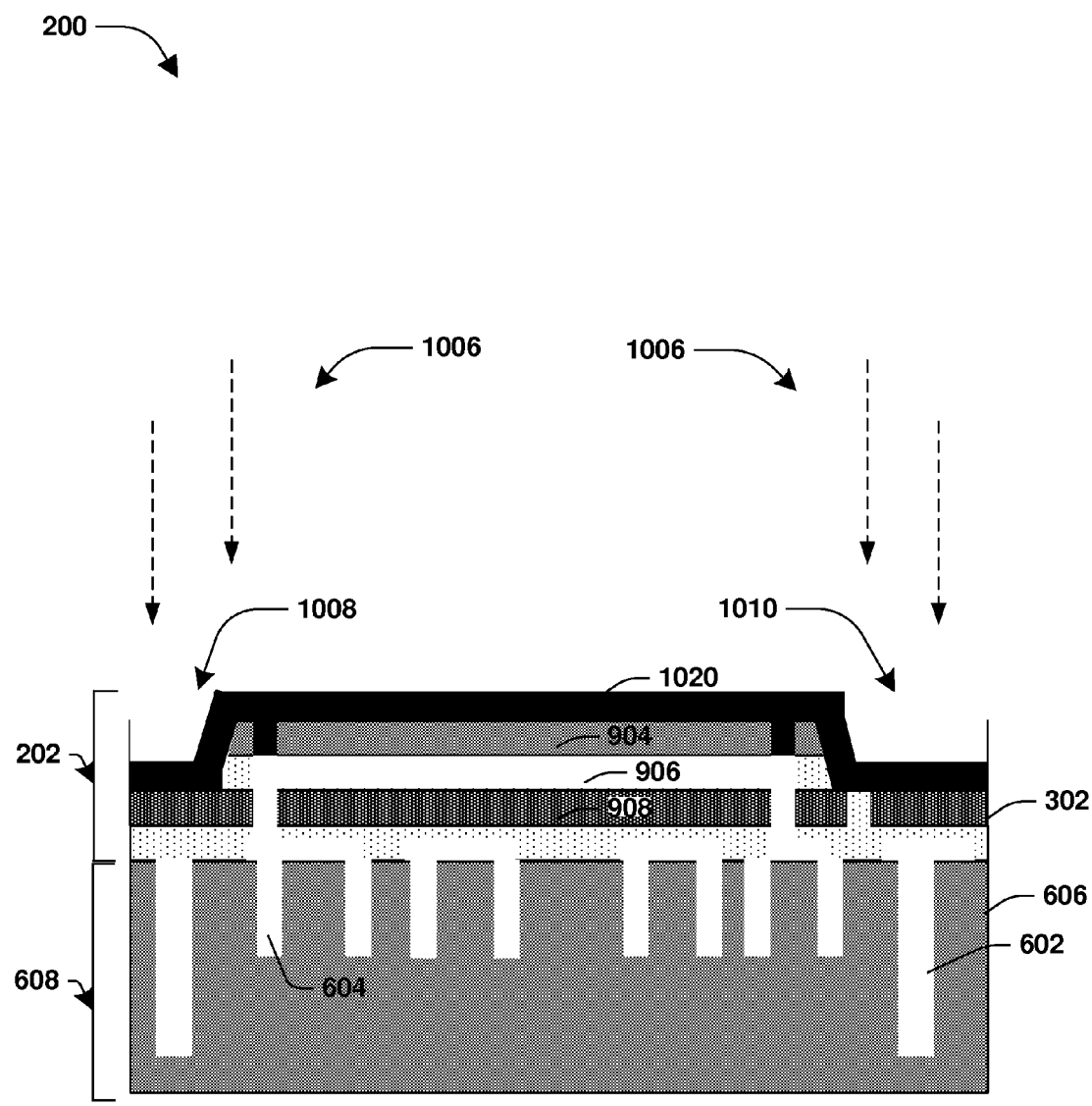
FIG. 10B is an illustration of a semiconductor arrangement comprising a microelectromechanical systems (MEMS) wafer bonded to a cap wafer, in accordance with some embodiments.
Figure 11:
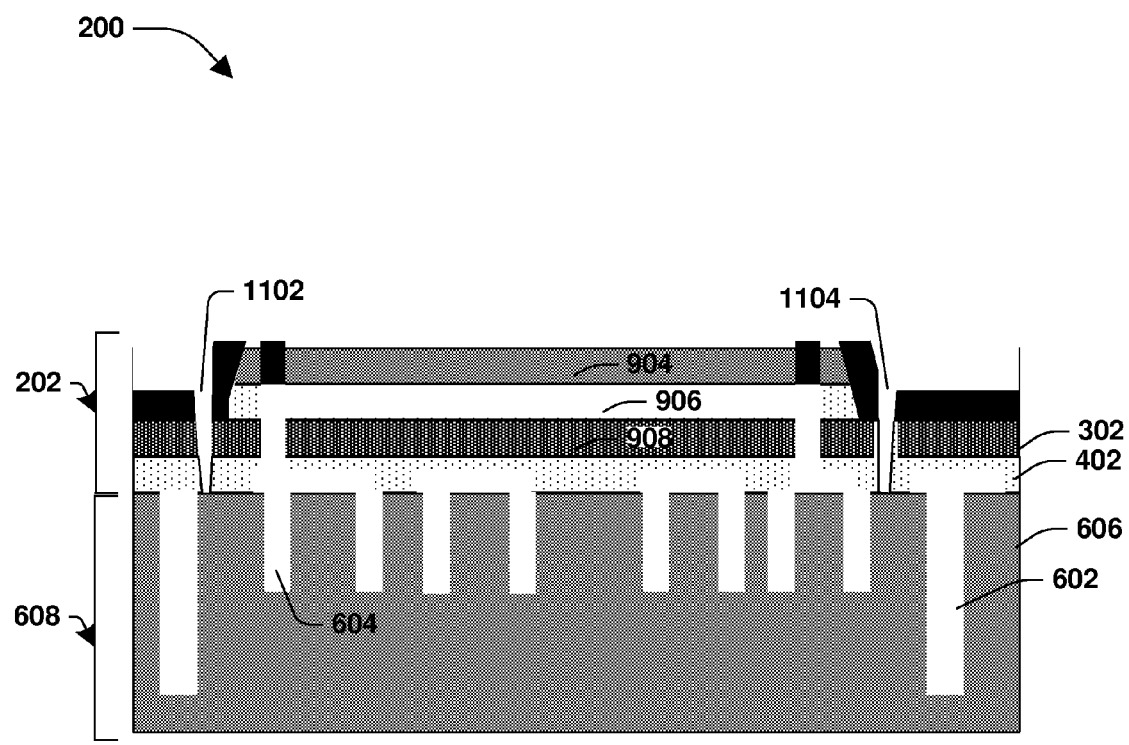
FIG. 11 is an illustration of a semiconductor arrangement comprising a microelectromechanical systems (MEMS) wafer bonded to a cap wafer, in accordance with some embodiments.

In some embodiments, the etching process 1006 is performed to remove the first side portion 1008 and the second side portion 1010, and then a metal layer 1020 is formed over the MEMS wafer 202, as illustrated in FIG. 10B. In this way, the high vacuum chamber 806 is sealed, such as from ambient air. In some embodiments, the metal layer 1020 is deposited to a thickness between about 3.5 um to about 4.5 um. The metal layer 1020 is patterned to remove a portion of the metal layer 1020, as illustrated in FIG. 11. One or more stress release structures, such as a first stress release structure 1102 and a second stress release structure 1104, are formed through the metal layer 1020, the poly layer 302, and the third oxide layer 402.

Figure 12:
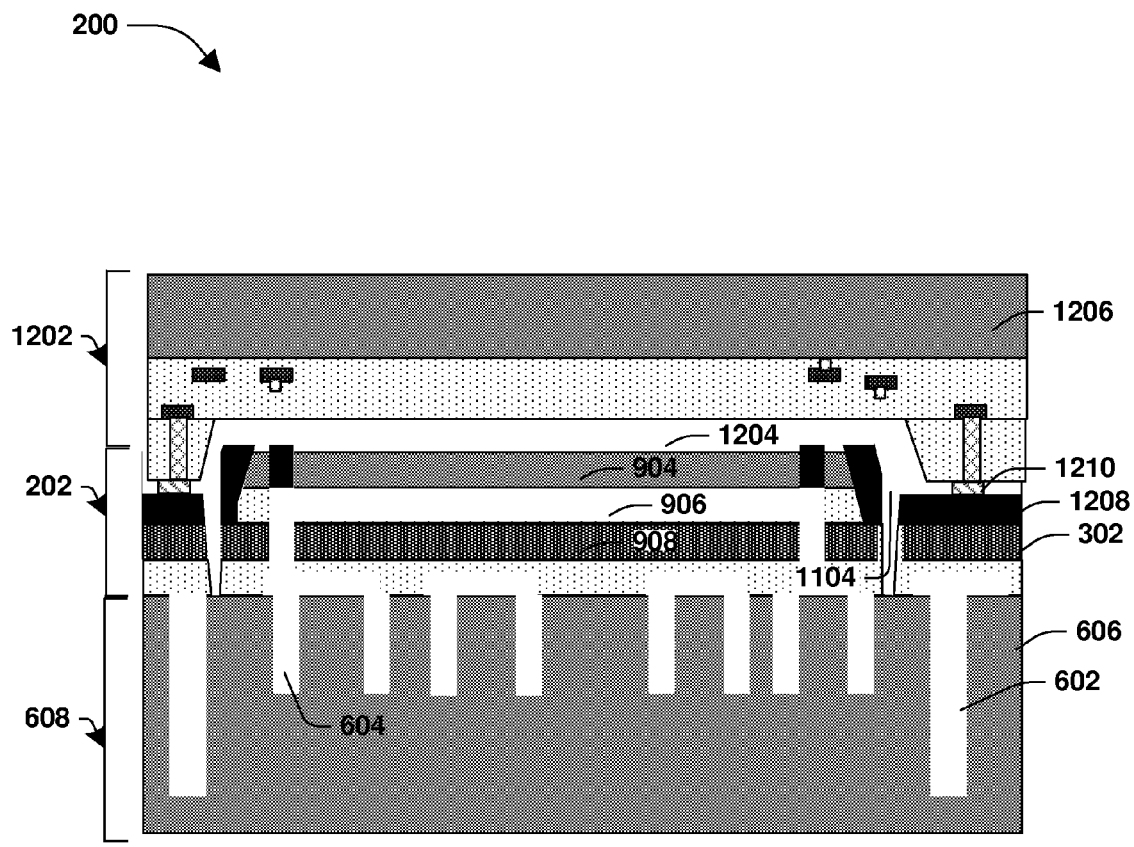
FIG. 12 is an illustration of a semiconductor arrangement comprising a microelectromechanical systems (MEMS) wafer bonded to a cap wafer and a complementary metal-oxide-semiconductor (CMOS) wafer, in accordance with some embodiments.

At 106, a CMOS wafer 1202 is bonded to the MEMS wafer 202, as illustrated in FIG. 12. In some embodiments, a eutectic bonding process is performed to bond the CMOS wafer 1202 to the MEMS wafer 202. In some embodiments, the eutectic bonding process utilizes pressure and temperature for bonding. In some embodiments, a first metal structure 1210 of the CMOS wafer 1202, such as germanium metal over a tungsten plug, is bonded to a second metal structure 1208 of the MEMS wafer 202, such as an aluminum structure. In some embodiments, the CMOS wafer 1202 comprises a silicon layer 1206. At 108, an ambient pressure chamber 1204 is formed between the CMOS wafer 1202 and the MEMS wafer 202. In some embodiments, a backside grinding process is performed to remove a portion of the silicon layer 606 of the cap wafer 608. In some embodiments, the backside grinding process is performed to control a thickness of the silicon layer 606 under the second chamber 602, such as to a thickness between about 15 um to about 35 um. The thickness of silicon under the second chamber 602 affects a softness/hardness of a first spring structure for the semiconductor arrangement 200 that is to be formed by the second chamber 602 and the silicon under the second chamber 602 (e.g., a first spring structure 1406 of FIG. 14A).

Figure 13:
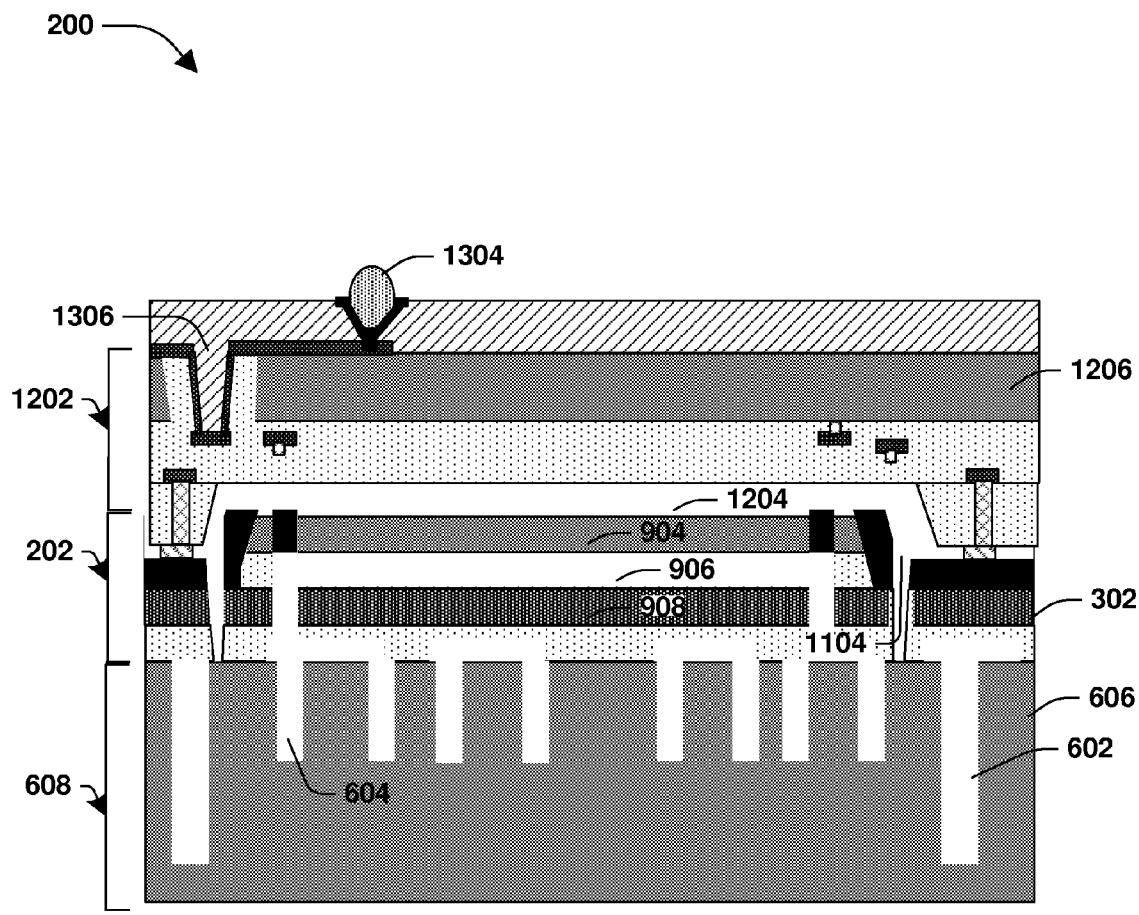
FIG. 13 is an illustration of a semiconductor arrangement comprising a microelectromechanical systems (MEMS) wafer bonded to a cap wafer and a complementary metal-oxide-semiconductor (CMOS) wafer, in accordance with some embodiments.

In some embodiments, a portion of the silicon layer 1206 of the CMOS wafer 1202 is removed, such as through a grinding process, for formation of a through-silicon via (TSV) structure 1306 on the CMOS wafer 1202, as illustrated in FIG. 13. In some embodiments, the TSV structure 1306 is connected to a metal connection 1304, such as a solder ball.

Figure 14A:
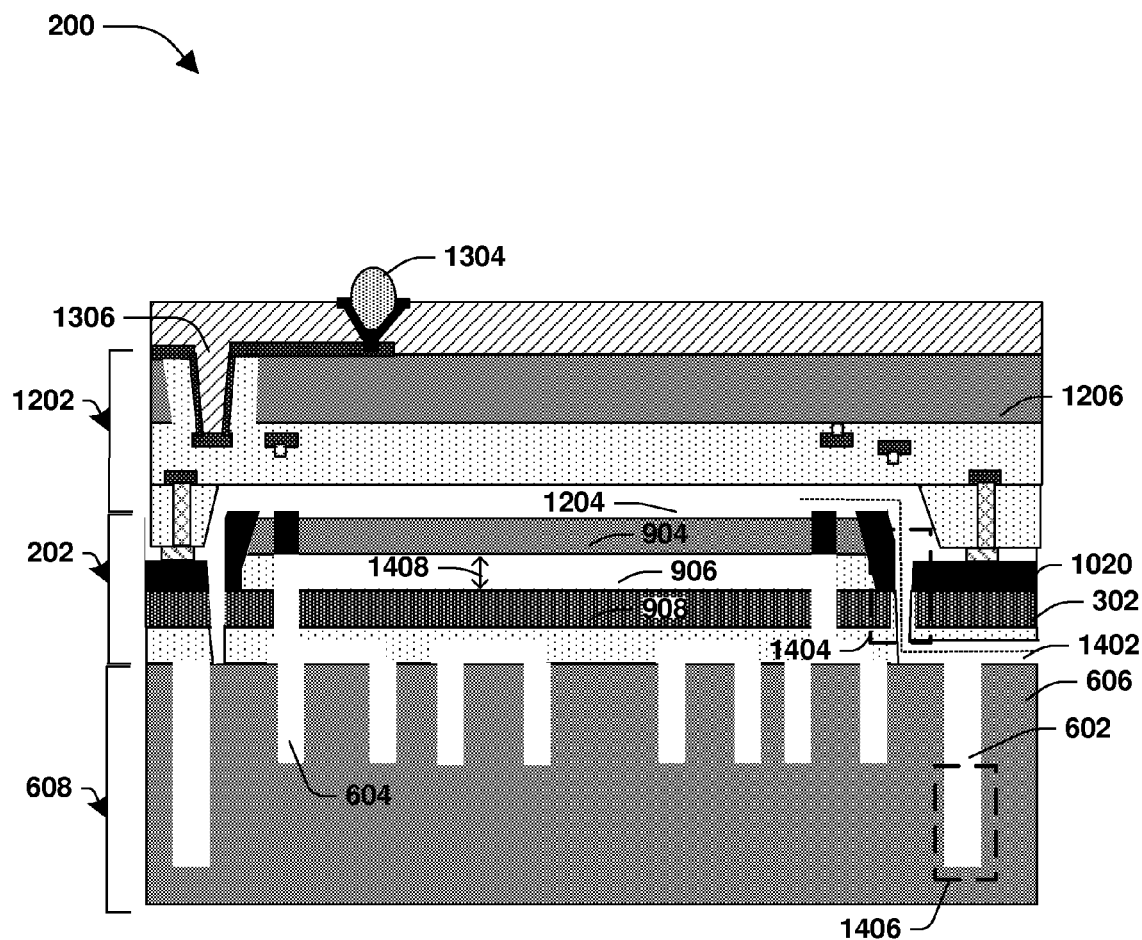
FIG. 14A is an illustration of a semiconductor arrangement comprising a microelectromechanical systems (MEMS) wafer bonded to a cap wafer and a complementary metal-oxide-semiconductor (CMOS) wafer, in accordance with some embodiments.
Figure 14B:
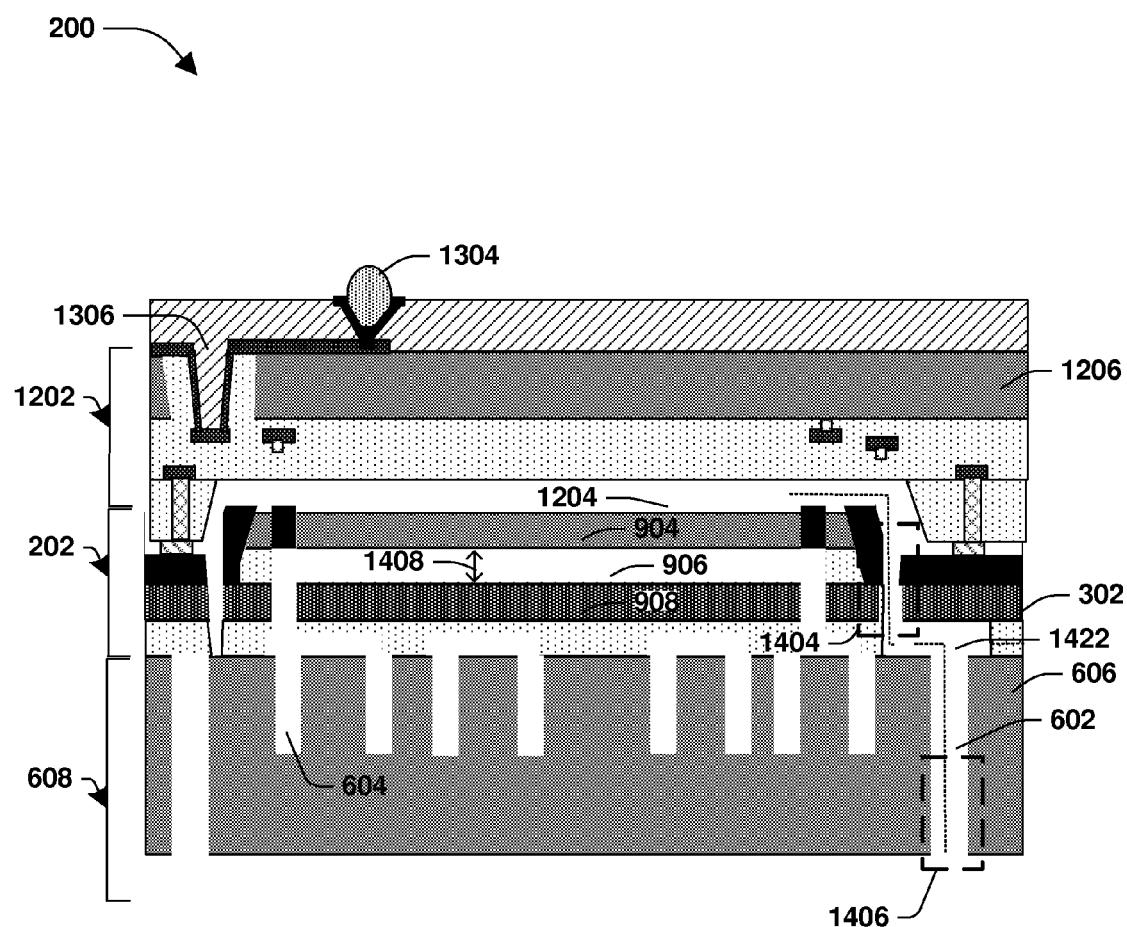
FIG. 14B is an illustration of a semiconductor arrangement comprising a microelectromechanical systems (MEMS) wafer bonded to a cap wafer and a complementary metal-oxide-semiconductor (CMOS) wafer, in accordance with some embodiments.

In some embodiments, the second vacuum chamber 602 is configured as the first spring structure 1406 for the semiconductor arrangement 200, as illustrated in FIG. 14A. In some embodiments, an ambient air pressure channel 1402 is formed between the MEMS wafer 202 and the cap wafer 608, as illustrated in FIG. 14A. In some embodiments, an ambient air pressure channel 1422 is formed through the second vacuum chamber 602 to ambient air, as illustrated in FIG. 14B. In some embodiments, a deep reactive-ion etching (DRIE) process is performed on the cap wafer 608 to form the ambient air pressure channel 1422. In some embodiments, a VHF release for oxide is performed through the ambient air pressure channel 1422 after the DRIE process.

At 110, the ambient pressure chamber 1204 is connected, such as through the ambient air pressure channel 1402 of FIG. 14A or the ambient air pressure channel 1422 of FIG. 14B, to ambient air through a second spring structure 1404. In some embodiments, the second spring structure 1404 comprises a poly portion of the poly layer 302 and a metal portion of the metal layer 1020. In some embodiments, the ambient pressure chamber 1204 is configured as a thermal insulation air gap between the CMOS wafer 1202 and the MEMS wafer 202. The thermal insulation air gap protects the MEMS wafer 202 from heat originating from the CMOS wafer 1202.

The high vacuum chamber 906 is configured as a sensing gap 1408, as illustrated in FIG. 14A. In some embodiments, the sensing gap 1408 is configured to deform based upon movement of the membrane 904 with respect to the poly layer 908. In some embodiments, a first sensing plate is coupled to the membrane 904 and the second sensing plate is coupled to the poly layer 908. The first sensing plate and the second sensing plate are configured to provide capacitance information used to determine deformation of the sensing gap 1408. The first spring structure 1406 and the second spring structure 1404 are configured to operate based upon deformation of the sensing gap 1408. At least one of the first spring structure 1406 or the second spring structure 1404 move in response to deformation of the sensing gap 1408 to reduce stress resulting from movement of the membrane 904 with respect to the poly layer 908.

Figure 14C:
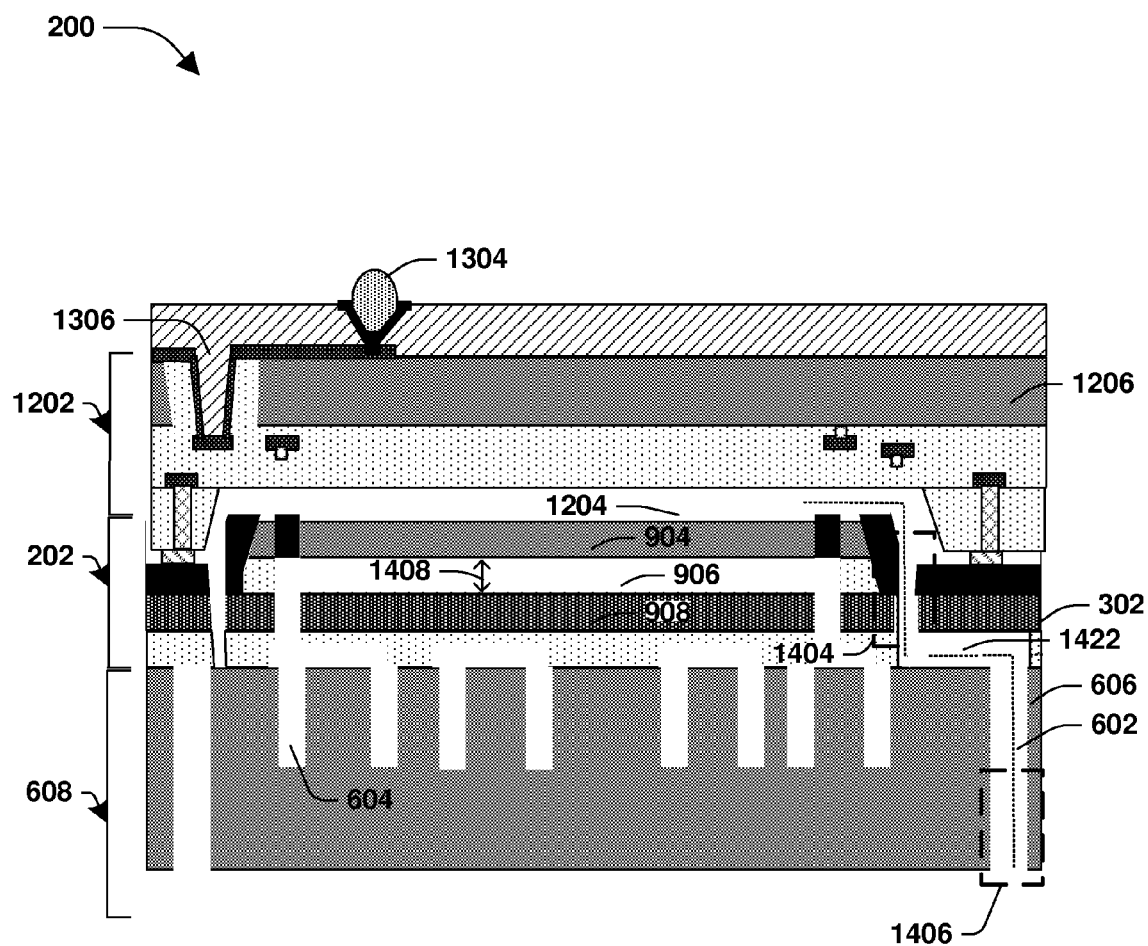
FIG. 14C is an illustration of a semiconductor arrangement comprising a microelectromechanical systems (MEMS) wafer bonded to a cap wafer and a complementary metal-oxide-semiconductor (CMOS) wafer, in accordance with some embodiments.
Figure 14D:
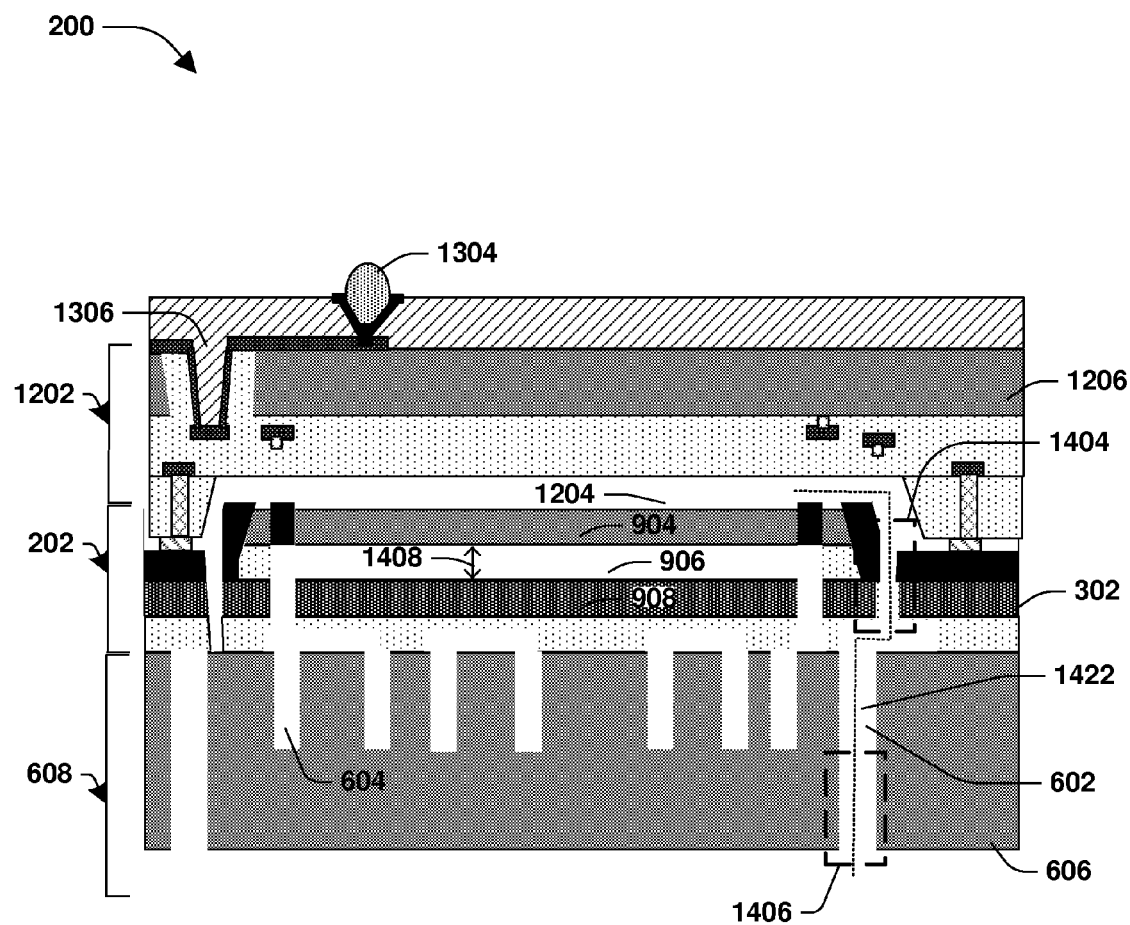
FIG. 14D is an illustration of a semiconductor arrangement comprising a microelectromechanical systems (MEMS) wafer bonded to a cap wafer and a complementary metal-oxide-semiconductor (CMOS) wafer, in accordance with some embodiments.
Figure 14E:
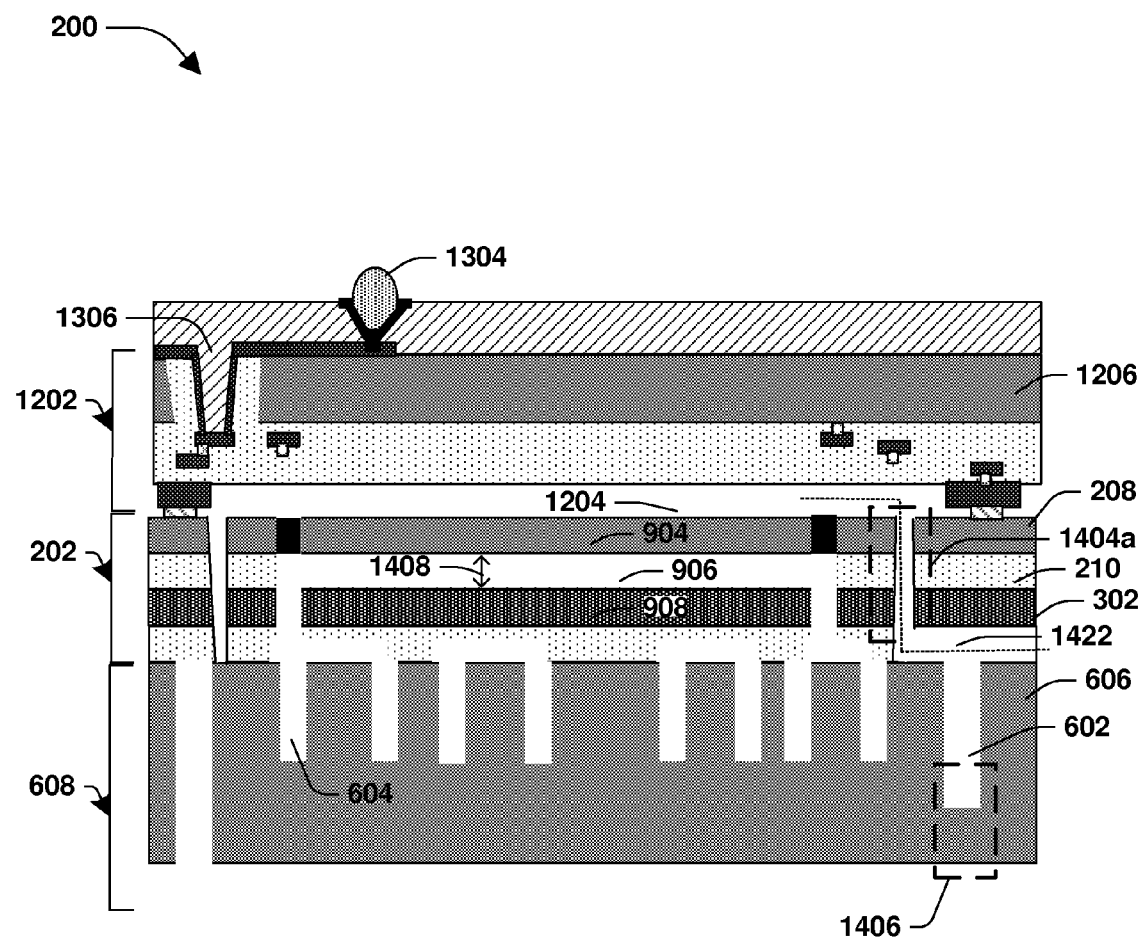
FIG. 14E is an illustration of a semiconductor arrangement comprising a microelectromechanical systems (MEMS) wafer bonded to a cap wafer and a complementary metal-oxide-semiconductor (CMOS) wafer, in accordance with some embodiments.

In some embodiments, the first spring structure 1406 of the second vacuum chamber 602 is positioned in a default location within the cap wafer 608 based upon a default deformation constraint, as illustrated in FIGS. 14A and 14B. In some embodiments, the first spring structure 1406 of the second vacuum chamber 602 is positioned in a first constrained location within the cap wafer 608 based upon a first deformation constraint, as illustrated in FIG. 14C. In some embodiments, the first spring structure 1406 of the second vacuum chamber 602 is positioned in a second constrained location within the cap wafer 608 based upon a second deformation constraint, as illustrated in FIG. 14D. In some embodiments, the first spring structure 1404 is formed between the high vacuum chamber 1204 and the second spring structure 1406, as illustrated in FIG. 14D. In some embodiments, the semiconductor arrangement 200 comprises a second spring structure 1404a, as illustrated in FIG. 14E. The second spring structure 1404a comprises at least one of a poly portion of the poly layer 302, an oxide portion of the second oxide layer 210, or a silicon portion of the second silicon layer 208.

At least one of the first spring structure 1406 of FIGS. 14A-14D, the second spring structure 1404 of FIGS. 14A-14D, or the second spring structure 1404a of FIG. 14E mitigate stress due to movement of the membrane 904 with respect to the poly layer 908. Such spring structures operate responsive to deformation of the sensing gap 1408 within the high vacuum chamber 906. The ambient pressure chamber 1204 is configured as the thermal insulation air gap to protect the MEMS wafer 202 from heat originating from the CMOS wafer 1202. In this way, CMOS outgassing, stress, and thermal damage are mitigated.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Further, unless specified otherwise, "first," "second," and/or the like are not intended to imply a temporal aspect, a spatial aspect, an ordering, etc. Rather, such terms are merely used as identifiers, names, etc. for features, elements, items, etc. For example, a first object and a second object generally correspond to object A and object B or two different or two identical objects or the same object.

Moreover, "exemplary" is used herein to mean serving as an example, instance, illustration, etc., and not necessarily as advantageous. As used herein, "or" is intended to mean an inclusive "or" rather than an exclusive "or". In addition, "a" and "an" as used in this application are generally to be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used in either the detailed description or the claims, such terms are intended to be inclusive in a manner similar to "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

According to an aspect of the instant disclosure, a semiconductor arrangement is provided. The semiconductor arrangement comprises a cap wafer. The cap wafer comprises a first vacuum chamber and a second vacuum chamber. The second vacuum chamber is configured as a first spring structure. The semiconductor arrangement comprises a microelectromechanical systems (MEMS) wafer formed over the cap wafer. The MEMS wafer comprises a high vacuum chamber coupled to the first vacuum chamber. The high vacuum chamber is configured as a sensing gap. The semiconductor arrangement comprises a complementary metal-oxide-semiconductor (CMOS) wafer that is formed over the MEMS wafer. The CMOS wafer comprises an ambient pressure chamber connected to the second vacuum chamber through a second spring structure. The first spring structure and the second spring structure are operable based upon deformation of the sensing gap.

According to an aspect of the instant disclosure, a semiconductor arrangement is provided. The semiconductor arrangement comprises a cap wafer. The cap wafer comprises a first vacuum chamber and a second vacuum chamber. The second vacuum chamber is configured as a first spring structure. The semiconductor arrangement comprises a microelectromechanical systems (MEMS) wafer formed over the cap wafer. The MEMS wafer comprises a high vacuum chamber, a poly layer, an oxide layer, and a silicon layer. The high vacuum chamber is configured as a sensing gap. The semiconductor arrangement comprises a complementary metal-oxide-semiconductor (CMOS) wafer that is formed over the MEMS wafer. The CMOS wafer comprises an ambient pressure chamber connected to the second vacuum chamber through a second spring structure. The first spring structure and the second spring structure are operable based upon deformation of the sensing gap. The second spring structure comprises at least one of a poly portion of the poly layer, an oxide portion of the oxide layer, or a silicon portion of the silicon layer.

According to an aspect of the instant disclosure, a method for forming a semiconductor arrangement is provided. The method comprises forming a microelectromechanical systems (MEMS) wafer comprising a high vacuum chamber configured as a sensing gap. The MEMS wafer is bonded to a cap wafer comprising a first vacuum chamber and a second vacuum chamber. The second vacuum chamber is configured as a first spring structure. The high vacuum chamber is coupled to the first vacuum chamber. A complementary metal-oxide-semiconductor (CMOS) is bonded to the MEMS wafer. An ambient pressure chamber is formed between the CMOS wafer and the MEMS wafer. The ambient pressure chamber is connected to ambient air through a second spring structure. The first spring structure and the second spring structure are operable based upon deformation of the sensing gap.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor arrangement, comprising:
   a cap wafer comprising a first vacuum chamber and a second vacuum chamber, the second vacuum chamber configured as a first spring structure;
   a microelectromechanical systems (MEMS) wafer formed over the cap wafer, the MEMS wafer comprising a high vacuum chamber coupled to the first vacuum chamber, the high vacuum chamber configured as a sensing gap; and
   a complementary metal-oxide-semiconductor (CMOS) wafer formed over the MEMS wafer, the CMOS wafer comprising an ambient pressure chamber connected to the second vacuum chamber through a second spring structure, the first spring structure and the second spring structure operable based upon a deformation of the sensing gap.

2. The semiconductor arrangement 1, the MEMS wafer comprising a membrane between the ambient pressure chamber and the high vacuum chamber, the MEMS wafer comprising a poly layer between the cap wafer and the high vacuum chamber.

3. The semiconductor arrangement of claim 2, the sensing gap configured to deform based upon movement of the membrane with respect to the poly layer.

4. The semiconductor arrangement of claim 2, the MEMS wafer comprising a first sensing plate coupled to the membrane, the MEMS wafer comprising a second sensing plate coupled to the poly layer.

5. The semiconductor arrangement of claim 4, the first sensing plate and the second sensing plate configured to provide capacitance information used to determine deformation of the sensing gap.

6. The semiconductor arrangement of claim 1, comprising:
an ambient pressure channel formed between the MEMS wafer and the cap wafer, the ambient pressure channel connecting the ambient pressure chamber to ambient air.

7. The semiconductor arrangement of claim 1, comprising:
an ambient pressure channel formed through the second vacuum chamber to ambient air, the ambient pressure channel connecting the ambient pressure chamber to the ambient air.

8. The semiconductor arrangement of claim 1, the first spring structure positioned in a default location within the cap wafer based upon a default deformation constraint.

9. The semiconductor arrangement of claim 1, the first spring structure positioned at a first constrained location within the cap wafer based upon a first deformation constraint.

10. The semiconductor arrangement of claim 1, the first spring structure positioned at a second constrained location within the cap wafer based upon a second deformation constraint, the first spring structure formed between the high vacuum chamber and the second spring.

11. The semiconductor arrangement of claim 1, the first vacuum chamber having a first depth that is less than a second depth of the second vacuum chamber.

12. The semiconductor arrangement of claim 1, the ambient pressure chamber configured as a thermal insulation air gap between the CMOS wafer and the MEMS wafer.

13. The semiconductor arrangement of claim 1, the CMOS wafer comprising a through-silicon via (TSV).

14. The semiconductor arrangement of claim 1, the MEMS wafer comprising a poly layer between the cap wafer and the high vacuum chamber, the MEMS wafer comprising a metal layer between the poly layer and the ambient pressure chamber, the second spring structure comprising a poly portion of the poly layer and a metal portion of the metal layer.

15. A semiconductor arrangement, comprising:
a cap wafer comprising a first vacuum chamber and a second vacuum chamber, the second vacuum chamber configured as a first spring structure;
a microelectromechanical systems (MEMS) wafer formed over the cap wafer, the MEMS wafer comprising a high vacuum chamber, a poly layer, an oxide layer, and a silicon layer, the high vacuum chamber coupled to the first vacuum chamber, the high vacuum chamber configured as a sensing gap; and
a complementary metal-oxide-semiconductor (CMOS) wafer formed over the MEMS wafer, the CMOS wafer comprising an ambient pressure chamber connected to the second vacuum chamber through a second spring structure, the first spring structure and the second spring structure operable based upon a deformation of the sensing gap, the second spring structure comprising at least one of a poly portion of the poly layer, an oxide portion of the oxide layer, or a silicon portion of the silicon layer.

16. The semiconductor arrangement of claim 15, the cap wafer comprising a third vacuum chamber, the high vacuum chamber coupled to the third vacuum chamber.

17. The semiconductor arrangement of claim 15, comprising:
an ambient pressure channel formed between the MEMS wafer and the cap wafer, the ambient pressure channel connecting the ambient pressure chamber to ambient air.

18. A method for forming a semiconductor arrangement, comprising:
forming a microelectromechanical systems (MEMS) wafer comprising a high vacuum chamber configured as a sensing gap;
bonding the MEMS wafer to a cap wafer comprising a first vacuum chamber and a second vacuum chamber, the second vacuum chamber configured as a first spring structure, the high vacuum chamber coupled to the first vacuum chamber;
bonding a complementary metal-oxide-semiconductor (CMOS) wafer to the MEMS wafer;
forming an ambient pressure chamber between the CMOS wafer and the MEMS wafer; and
connecting the ambient pressure chamber to ambient air through a second spring structure, the first spring structure and the second spring structure operable based upon a deformation of the sensing gap.

19. The method of claim 18, the forming a MEMS wafer comprising:
forming an oxide layer over a silicon on insulator (SOI) wafer;
forming a poly layer over the oxide layer; and
performing a vapor hydrogen fluoride (VHF) release to remove a portion of the oxide layer to form the high vacuum chamber and to form a connection between the high vacuum chamber and the first vacuum chamber.

20. The method of claim 19, the bonding a CMOS wafer to the MEMS wafer comprising:
forming a metal layer over the MEMS wafer, the second spring structure comprising a metal portion of the metal layer and a poly portion of the poly layer; and
bonding the CMOS wafer to the metal layer.

* * * * *